(12) United States Patent
Yen et al.

(10) Patent No.: US 9,508,817 B2
(45) Date of Patent: Nov. 29, 2016

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Yung-Sung Yen, New Taipei (TW); Huan-Just Lin, Hsinchu (TW); Chun-Hsiung Lin, Zhubei (TW); Chi-Cheng Hung, Toufen Township, Miaoli County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/454,645

(22) Filed: Aug. 7, 2014

(65) Prior Publication Data

US 2016/0043173 A1 Feb. 11, 2016

(51) Int. Cl.
*H01L 29/78* (2006.01)
*H01L 29/423* (2006.01)
*H01L 29/786* (2006.01)
*H01L 29/06* (2006.01)

(52) U.S. Cl.
CPC ..... *H01L 29/42392* (2013.01); *H01L 29/0676* (2013.01); *H01L 29/78642* (2013.01); *H01L 29/78696* (2013.01)

(58) Field of Classification Search
CPC ....... H01L 29/66; H01L 29/06; H01L 29/10; H01L 29/78; H01L 29/423; H01L 29/7827; H01L 29/66666; H01L 29/0669; H01L 29/42392
USPC .......................... 257/211, 329, 353, 288, 344
See application file for complete search history.

(56) References Cited

U.S. PATENT DOCUMENTS 6,399,441 B1 * 6/2002 Ogura et al. .................. 438/257
2011/0001179 A1 * 1/2011 Yanagi ............... G11C 16/0408
257/316

* cited by examiner

*Primary Examiner* — Chuong A Luu
(74) *Attorney, Agent, or Firm* — McDermott Will & Emery LLP

(57) ABSTRACT

A semiconductor structure, a semiconductor device, and a method for forming the semiconductor device are provided. In various embodiments, the method for forming the semiconductor device includes forming transistors on a substrate. Forming each transistor includes forming a doped region on the substrate. A nanowire is formed protruding from the doped region. An interlayer dielectric layer is deposited over the doped region. A dielectric layer is deposited over the interlayer dielectric layer and surrounding each of the nanowires. A first gate layer is deposited over the dielectric layer. The dielectric layer and first gate layer are etched to expose portions of the nanowires and the interlayer dielectric layer. A second gate layer is formed over the exposed interlayer dielectric layer and surrounding the first gate layer. Then, the second gate layer was patterned to remove the second gate layer on the interlayer dielectric layer between the transistors.

20 Claims, 6 Drawing Sheets

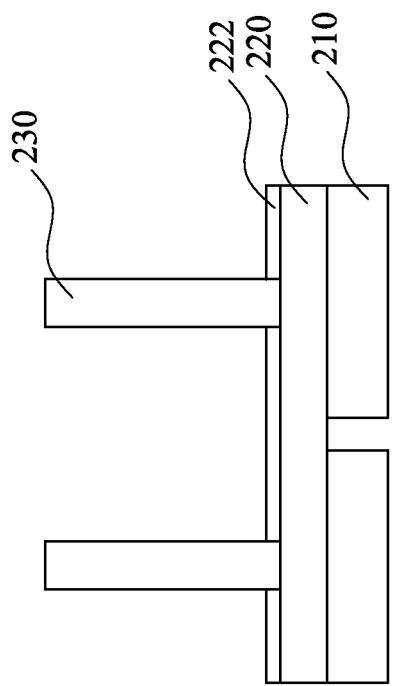
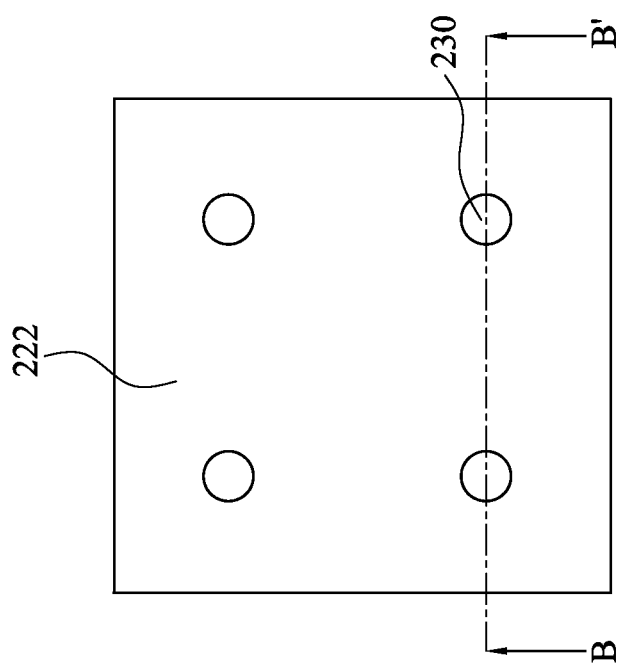
Fig. 2B
Fig. 2A

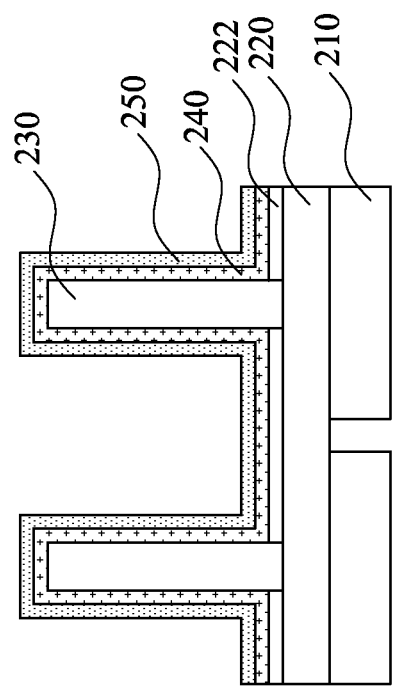
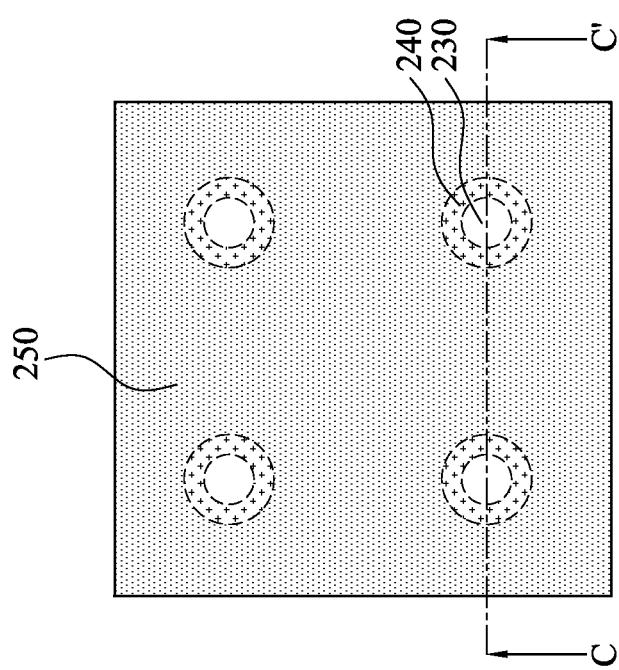
Fig. 2D
Fig. 2C

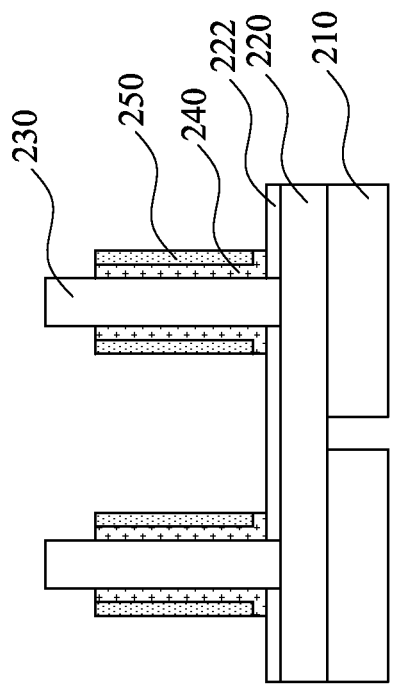
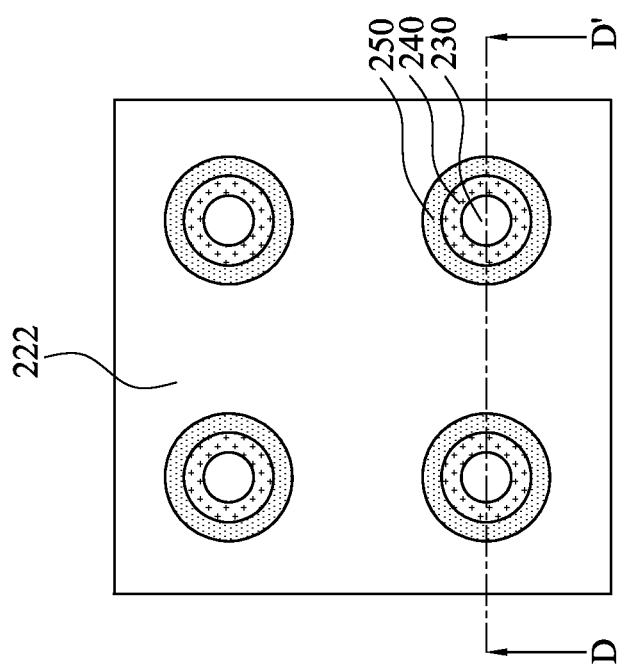
Fig. 2E
Fig. 2F

SEMICONDUCTOR DEVICE AND MANUFACTURING METHOD THEREOF

BACKGROUND

The semiconductor industry has experienced rapid growth. The manufacturing of a field-effect transistor (FET) is focusing on the scaling down of the dimensions of the FET to improve the packing density of the semiconductor device. However, physical constraints in achieving ultra-small dimensions in the classical planar transistor led to the development of a non-planar transistor. At present, a gate-all-around (GAA) FET has been developed, and considered as one of the next generation non-planar transistors with ultra-small dimensions and a good short-channel effect (SCE).

A vertical FET is one of the GAA FET, which the source-drain current flows in a direction perpendicular to the substrate surface. The vertical FET applies a plurality of semiconductor nanowires each surrounded by gate electrode as the channel between a source electrode and a drain electrode. However, there are difficulties in improving the packing density of the semiconductor device because of the limitations in current manufacturing technology.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A through 2J are top views and cross-sectional views at various stages of manufacturing a semiconductor device in accordance with some embodiments in the present disclosure.

DETAILED DESCRIPTION

Figure 1B:
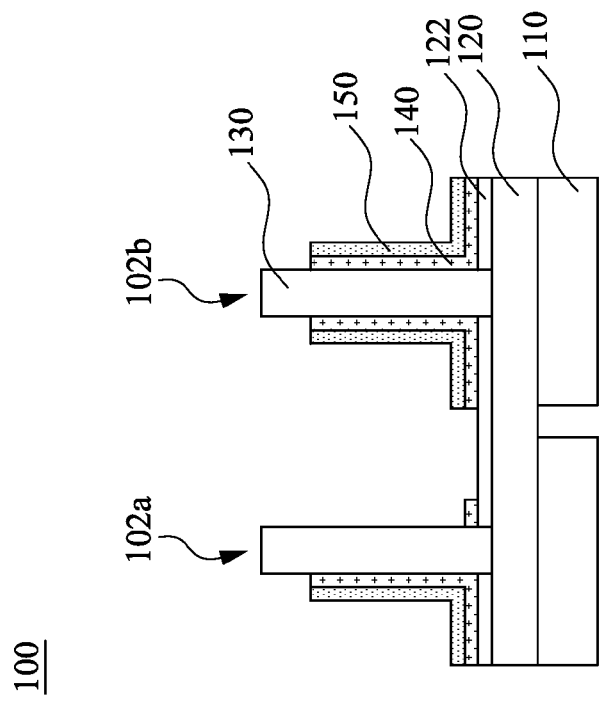
FIGS. 1A and 1B are a top view and a cross-sectional view of a semiconductor device manufactured by general method respectively.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The packing density of the semiconductor device is determined by the pitch of the nanowires, and reducing the pitch can improve the packing density. However overlay shift may occur while patterning, and as the dimensions of the semiconductor device decreased, the respective nanowires may not be fully surrounded by the gate electrode because of the limitations in current technology of photolithography and etching process. The insufficiently surrounded nanowires may lead to the failure of the semiconductor device.

Figure 1A:
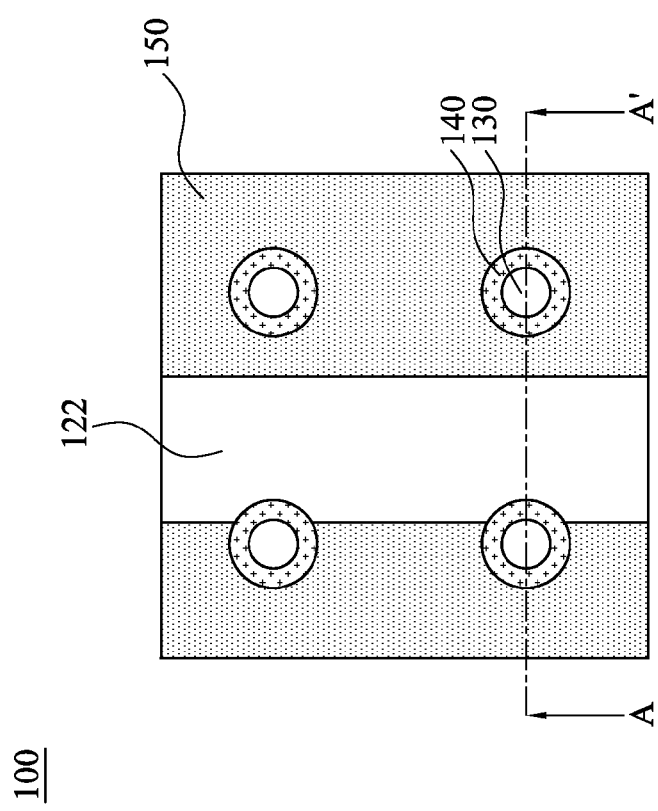

FIGS. 1A and 1B show a semiconductor device 100 manufactured by general method that overlay shift occurred while pattering. FIG. 1A shows a top view of the semiconductor device 100, and FIG. 1B shows a cross-sectional view through A-A' shown in FIG. 1A. The general method for forming the semiconductor device 100 includes forming at least two transistors on a substrate 110. For ease of the description, FIGS. 1A and 1B show two transistors 102a and 102b, wherein each transistor 102a/102b includes two nanowires 130. Forming each transistor 102a/102b includes forming a first doped region 120 on the substrate 110. A nanowire 130 is formed protruding from the first doped region 120. In embodiments, the nanowire 130 is multiple nanowires sandwiched by a source region and a drain region in a transistor. An interlayer dielectric (ILD) layer 122 is deposited over the first doped region 120, and a dielectric layer 140 is deposited over the ILD layer 122 and surrounding the nanowires 130. A gate layer 150 is deposited over the dielectric layer 140 and the dielectric layer 140 and the gate layer 150 are patterned to expose top portions of the nanowires 130. Further, the gate layer 150 on the ILD layer 122 between the transistors 102a and 102b is removed. When overlay shift occurs, as shown in FIGS. 1A and 1B, the dielectric layer 140 and the gate layer 150 on the nanowires are partially removed, and thus the nanowires 130 are exposed. The nanowires 130 are not sufficiently surrounded by the dielectric layer 140 and the gate layer 150, which may induce short circuits between the gate layer 150 and the first doped region 120, and resulted in the failure of the semiconductor device 100. Therefore, the packing density of the semiconductor device cannot be further improved if the semiconductor device is manufactured by general method.

In order to solve the above-mentioned problems, a semiconductor structure, a semiconductor device, and a method for forming the semiconductor device are provided according to various embodiments of the present disclosure, which may scale down the dimensions of the semiconductor devices while preventing the risk of short circuits between the doped region and the gate layer.

It is noteworthy that the following operating sequences for manufacturing semiconductor devices are merely examples and are not intended to be limiting, and various changes, substitutions, and alterations may be made without departing from the spirit and scope of the present disclosure.

FIGS. 2A through 2J are top views and cross-sectional views at various stages of manufacturing a semiconductor device 200 in accordance with some embodiments in the present disclosure. For ease of the description, FIGS. 2A through 2J show two transistors 202a and 202b on the semiconductor device 200.

Referring to FIGS. 2A and 2B, FIG. 2A is a top view at one stage of manufacturing the semiconductor device 200 in accordance with some embodiments in the present disclosure, and FIG. 2B is the cross-sectional view through B-B' shown in FIG. 2A. In FIGS. 2A and 2B, transistors 202a and 202b are formed on the substrate 210. Forming each of the transistors 202a and 202b includes forming a first doped region 220 on the substrate 210. A nanowire 230 is formed protruding from the first doped region 220. In embodiments, the nanowire 230 is multiple nanowires in a transistor. An interlayer dielectric (ILD) layer is disposed over the first doped region 220. In some embodiments, the nanowires 230 are vertical nanowires.

The material of the substrate 210 may be any nonconductive or highly resistive semiconductor material. Examples of the material of the substrate 210 include but are not limited to aluminum oxide, magnesium oxide, zinc oxide, silicon oxide, silicon nitride, undoped silicon, silicon carbide, glass, and a combination thereof.

The first doped region 220 may be a source or a drain. The first doped region 220 of each transistors 202a/202b may be connected or separated.

The nanowire 230 may be formed by any suitable process.

In some embodiments of the present disclosure, the nanowire may be formed by depositing the material of the nanowire over the doped region, and etching the material to form the nanowire on the predetermined areas.

In other embodiments of the present disclosure, the nanowire may be formed by forming a sacrifice layer over the substrate, and etching the sacrifice layer to form via on the predetermined areas. Then, the material of the nanowire is filled in the via, and the remaining sacrifice layer is removed. The material of the nanowire may be filled by deposition or plating such as electroplating.

In yet other embodiments of the present disclosure, the nanowire may be formed by applying nanowire precursor on the predetermined area, and growing the nanowire. The growing conditions depend on the nanowire precursor used.

In some embodiments of the present disclosure, the nanowire 230 has a diameter in the range from about 4 nm to 15 nm. A pitch is the distance between two neighboring nanowires. In some embodiments of the present disclosure, the nanowires 230 of the transistors 202a and 202b have a pitch in the range from about 10 nm to 40 nm.

The ILD layer 222 may be deposited by any suitable process. In some embodiments of the present disclosure, the ILD layer is deposited by a plasma enhanced chemical vapor deposition (PECVD) process, a low-pressure chemical vapor deposition (LPCVD) process, or an atmospheric pressure chemical vapor deposition (APCVD) process. The material of the ILD layer 222 may be any suitable material. In some embodiments of the present disclosure, the material of the ILD layer 222 is oxide or nitride.

Referring to FIGS. 2C and 2D, FIG. 2C is a top view at one stage of manufacturing the semiconductor device 200 in accordance with some embodiments in the present disclosure, and FIG. 2D is the cross-sectional view through C-C' shown in FIG. 2C. In FIGS. 2C and 2D, a dielectric layer 240 is deposited over the ILD layer 222 and surrounding the nanowire 230. A first gate layer 250 is deposited over the dielectric layer 240. At this manufacturing stage, the whole semiconductor device is covered by the first gate layer 250, and thus doted lines in FIG. 2C show the positions of the nanowires 230 and the dielectric layer 240 under the first gate layer 250.

In some embodiments of the present disclosure, depositing the dielectric layer 240 is performed by depositing a high-k dielectric layer. The high-k dielectric layer may have a thickness in the range from about 3 nm to 20 nm. The high-k dielectric layer may be deposited by any suitable process. Examples of the depositing process of the high-k dielectric layer include but are not limited to a chemical vapor deposition (CVD) process, a plasma enhanced chemical vapor deposition (PECVD) process, or an atomic layer deposition (ALD). The material of the high-k dielectric layer may be any suitable material. Examples of the material of the high-k dielectric layer include but are not limited to hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. As used herein, the term "high-k dielectric" refers to dielectrics having a dielectric constant, k, greater than about 4.0, which is higher than the k value of $SiO_2$.

In some embodiments of the present disclosure, depositing the first gate layer 250 is performed by depositing a first metal gate layer. The material of the first metal gate layer may be any suitable material. In some embodiments of the present disclosure, the material of the first metal gate layer is titanium nitride (TiN), tantalum nitride (TaN), titanium aluminide (TiAl), or a combination thereof.

Referring to FIGS. 2E and 2F, FIG. 2E is a top view at one stage of manufacturing the semiconductor device 200 in accordance with some embodiments in the present disclosure, and FIG. 2F is the cross-sectional view through D-D' shown in FIG. 2E. In FIGS. 2E and 2F, a portion of the dielectric layer 240 and the first gate layer 250 are etched to expose a top portion of the nanowire 230 and a portion of the ILD layer 222. At this manufacturing stage, bottom portion of the nanowire 230 are fully surrounded by the dielectric layer 240 and the first gate layer 250.

According to various embodiments of the present disclosure, the portion of the dielectric layer 240 and the first gate layer 250 are etched by an anisotropic etching process. In some embodiments of the present disclosure, a spacer process is applied to the etching of the dielectric layer 240 and the first gate layer 250.

Figure 2H:
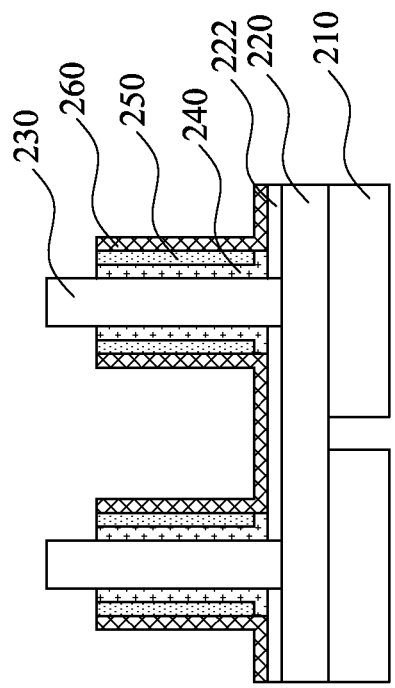
Figure 2G:
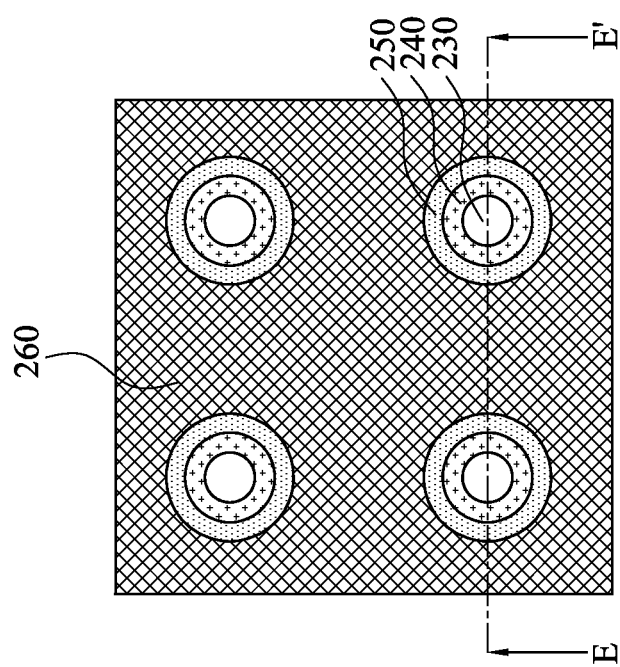

Referring to FIGS. 2G and 2H, FIG. 2G is a top view at one stage of manufacturing the semiconductor device 200 in accordance with some embodiments in the present disclosure, and FIG. 2H is the cross-sectional view through E-E' shown in FIG. 2E. In FIGS. 2G and 2H, a second gate layer 260 is formed over the exposed ILD layer 222 and surrounding the first gate layer 250.

According to various embodiments of the present disclosure, the second gate layer 260 is formed by depositing a second gate material over the exposed ILD layer 222 and nanowire 230 and surrounding the first gate layer 250 (not shown). And the second gate material is etched to expose the top portion of the nanowire 230, so as to form the second gate layer 260.

In some embodiments of the present disclosure, depositing the second gate layer 260 is performed by depositing a second metal gate layer. The material of the second metal gate layer may be any suitable material. In some embodiments of the present disclosure, the material of the second metal gate layer is titanium nitride (TiN), tantalum nitride (TaN), titanium aluminide (TiAl), or a combination thereof.

Figure 2I:
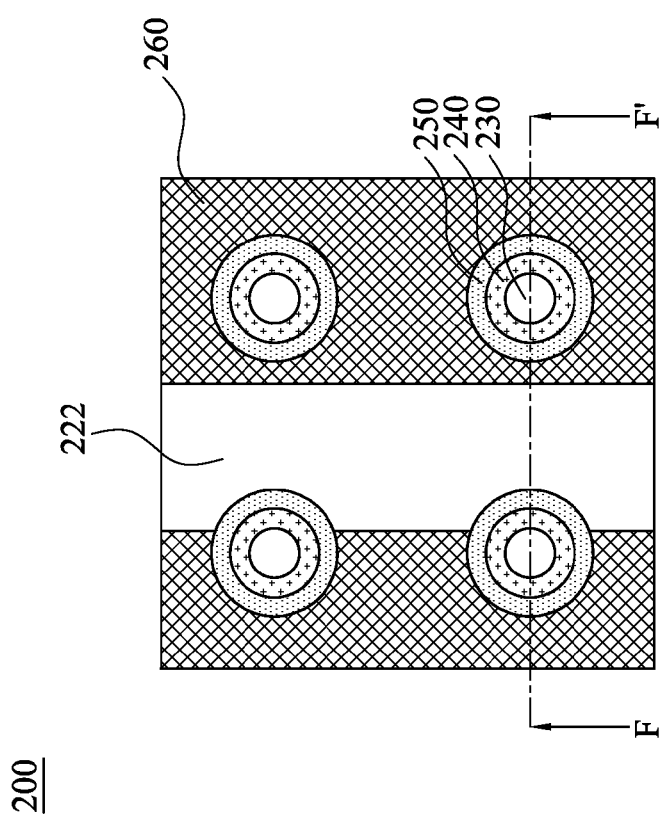
Figure 2J:
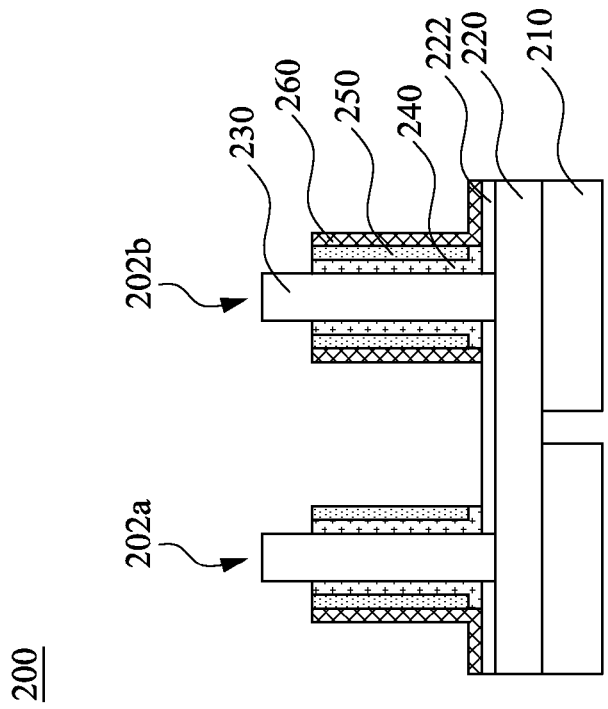

Referring to FIGS. 2I and 2J, FIG. 2I is a top view at one stage of manufacturing the semiconductor device 200 in accordance with some embodiments in the present disclosure, and FIG. 2J is the cross-sectional view through F-F' shown in FIG. 2I. In FIGS. 2I and 2J, the second gate layer 260 is patterned to remove the second gate layer 260 on the ILD layer 222 between two transistor 202a and 202b, and the semiconductor device 200 is thereby manufactured. The second gate layer 260 interconnects the nanowires 230 of each transistor 202a/202b. FIGS. 2I and 2J show one possible form of the manufactured semiconductor device 200 that overlay shift occurred while pattering.

FIGS. 2I and 2J show one possible form of the semiconductor device 200 manufactured by the method according to various embodiments of the present disclosure, wherein the second gate layer 260 on the ILD layer 222 between the transistors 202a and 202b and the second gate layer 260 on one side of the first gate layer 250 of the transistor 202a are removed. In some embodiments of the present disclosure, only the second gate layer 260 on the ILD layer 222 between the transistors 202a and 202b is removed in the semiconductor device. In other embodiments of the present disclosure, the second gate layer 260 on the ILD layer 222 between the transistors 202a and 202b and the second gate layer 260 on one side of the first gate layer 250 of the two transistors 202a and 202b are removed in the semiconductor device.

According to various embodiments of the present disclosure, the method for manufacturing the semiconductor device 200 further includes forming a second doped region (not shown) over the nanowire, wherein the nanowire is sandwiched by the first doped region and the second doped region.

In some embodiments of the present disclosure, the second doped region may be formed simultaneously with the first doped region 220. In other embodiments of the present disclosure, the second doped region may be formed after the second gate layer 260 is patterned. The second doped region may be a source or a drain depending on the first doped region 220.

In the method for manufacturing the semiconductor device 200 in accordance with some embodiments in the present disclosure, the dielectric layer 240 and the first gate layer 250 are first formed to fully surround the nanowires 230 of the transistors 202a and 202b, wherein the function of the dielectric layer 240 and the first gate layer 250 is similar to the gate electrode in general semiconductor device. Then, the second gate layer is formed and patterned to interconnect the nanowires 230 of each transistor 202a/202b. Even if overlay shift occurred while patterning and consequently the second gate layer 260 on the first gate layer 250 is partially removed, the nanowires 230 of the semiconductor device 200 may still be fully surrounded by the dielectric layer 240 and the first gate layer 250 as shown in FIGS. 2I and 2J. The pitch of the nanowires may be scaled-down while preventing the risk of short circuits between the doped region and the gate layer, and thus scaling down the dimension of the transistor. Therefore, the packing density of the semiconductor device may be further increased.

Still referring to FIGS. 2I and 2J, the semiconductor device 200 in accordance with some embodiments in the present disclosure includes a substrate 210 having two transistors 202a and 202b thereon, wherein each transistor 202a/202b includes a first doped region 220; a nanowire 230 protruding from the first doped region 220; an ILD layer 222 over the first doped region 220; a dielectric layer 240 surrounding the nanowire 230; a first gate layer 250 surrounding the dielectric layer 240; and a second gate layer 260 over the first gate layer 250 and the ILD layer 222. The semiconductor device 200 is without the second gate layer 260 on the ILD layer 222 between the transistors 202a and 202b and on one side of the first gate layer 250 of the transistor 202a. In embodiments, the nanowire 230 is multiple nanowires in a transistor.

FIGS. 2I and 2J show one possible form of the semiconductor device 200 according to various embodiments of the present disclosure. In some embodiments of the present disclosure, the semiconductor device is without the second gate layer 260 on the ILD layer 222 between the transistors 202a and 202b. In other embodiments of the present disclosure, the semiconductor device is without the second gate layer 260 on the ILD layer 222 between the transistors 202a and 202b and on one side of the first gate layer 250 of the two transistors 202a and 202b.

In some embodiments of the present disclosure, the nanowire 230 has a diameter in the range from about 4 nm to 15 nm. In some embodiments of the present disclosure, the nanowires 230 of the transistors 202a and 202b have a pitch in the range from about 10 nm to 40 nm.

In some embodiments of the present disclosure, the dielectric layer 240 may be a high-k dielectric layer. The high-k dielectric layer may have a thickness in the range from about 3 nm to 20 nm.

In some embodiments of the present disclosure, the first gate layer 250 and the second gate layer 260 are a first metal gate layer and a second metal gate layer respectively. The material of the first metal gate layer and the second metal gate layer may be any suitable material. In some embodiments of the present disclosure, the materials of the first metal gate layer and the second metal gate layer is independently selected from titanium nitride (TiN), tantalum nitride (TaN), titanium aluminide (TiAl), or a combination thereof.

According to various embodiments of the present disclosure, the semiconductor device further includes a second doped region, wherein the nanowire is sandwiched by the first doped region and the second doped region.

The nanowires 230 of the semiconductor device 200 are fully surrounded by the dielectric layer 240 and the first gate layer 250, wherein the function of the dielectric layer 240 and the first gate layer 250 is similar to the gate electrode in general semiconductor device. The second gate layer 260 interconnects the nanowires 230 of each transistor 202a/202b. Because of the two gate layer layers (the first gate layer 250 and the second gate layer 260), the pitch of the nanowires may be scaled-down while preventing the risk of short circuits between the doped region and the gate layer, and thus scaling down the dimension of the transistor. Therefore, the packing density of the semiconductor device may be further increased.

The embodiments of the present disclosure discussed above have advantages over exiting methods and systems. The nanowires of the semiconductor device according to various embodiments of the present disclosure are fully surrounded by the first gate layer as the gate layer in general semiconductor device, and are interconnected by the second gate layer. Because of the two gate layer layers (the first gate layer and the second gate layer), the packing density is increased by scaling down the pitch of nanowires in a semiconductor device while preventing the forming of insufficiently surrounded nanowires, and thus preventing the risk of short circuits between the doped region and the gate layer. It is understood, however, that other embodiments may have different advantages, and that no particular advantages is required for all embodiments.

Thus, it will be appreciated that described herein is an embodiment of a method forming a semiconductor device, including forming at least two transistors on a substrate, wherein forming each of the transistors includes forming a first doped region on the substrate. Then, a nanowire is formed protruding from the first doped region. An interlayer dielectric layer is deposited over the first doped region. A dielectric layer is deposited over the interlayer dielectric layer and surrounding the nanowire, and a first gate layer is deposited over the dielectric layer. A portion of the dielectric layer and the first gate layer are etched to expose a top portion of the nanowire and a portion of the interlayer dielectric layer, and a second gate layer is formed over the exposed interlayer dielectric layer and surrounding the first gate layer. After forming the transistors on the substrate, the second gate layer was patterned to remove the second gate layer on the interlayer dielectric layer between the at least two transistors.

In accordance with another embodiment, the present disclosure disclosed a semiconductor structure, including a substrate having a first doped region thereon, a nanowire protruding from the first doped region, an interlayer dielectric layer over the first doped region, a dielectric layer surrounding the nanowire, a first gate layer surrounding the dielectric layer, and a second gate layer over the first gate layer and the interlayer dielectric layer, wherein at least one side of the semiconductor structure is without the second gate layer on the interlayer dielectric layer.

In accordance with yet another embodiment, the present disclosure disclosed a semiconductor device, including a substrate having at least two transistors thereon, wherein each of the transistors includes a first doped region, a nanowire protruding from the first doped region, an interlayer dielectric layer over the first doped region, a dielectric layer surrounding the nanowire, a first gate layer surrounding the dielectric layer, and a second gate layer over the first gate layer and the interlayer dielectric layer. The semiconductor device is without the second gate layer on the interlayer dielectric layer between the at least two transistors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a substrate having a first doped region thereon;
a nanowire protruding from the first doped region and being in direct contact with the first doped region;
an interlayer dielectric layer over the first doped region;
a dielectric layer surrounding the nanowire, and a top portion of the nanowire being uncovered by the dielectric layer;
a first gate layer surrounding the dielectric layer; and
a second gate layer over the first gate layer and the interlayer dielectric layer,
wherein at least one side of the semiconductor structure is without the second gate layer on the interlayer dielectric layer.

2. The semiconductor structure of claim 1, wherein the nanowire has a diameter in the range from about 4 nm to 15 nm.

3. The semiconductor structure of claim 1, wherein the dielectric layer is a high-k dielectric layer.

4. The semiconductor structure of claim 3, wherein the high-k dielectric layer has a thickness in the range from about 3 nm to 20 nm.

5. The semiconductor structure of claim 1, wherein the first gate layer and the second gate layer are a first metal gate layer and a second metal gate layer respectively.

6. The semiconductor structure of claim 5, wherein the materials of the first metal gate layer and the second metal gate layer are independently selected from titanium nitride (TiN), tantalum nitride (TaN), titanium aluminide (TiAl), or a combination thereof.

7. The semiconductor structure of claim 1, further comprising a second doped region, wherein the nanowire is sandwiched by the first doped region and the second doped region.

8. The semiconductor structure of claim 1, wherein the nanowire is a vertical nanowire.

9. The semiconductor structure of claim 1, wherein the semiconductor device is without the second gate layer on one side of the first gate layer.

10. A semiconductor device, comprising:
a substrate having at least two transistors thereon, wherein each of the transistors comprises:
a first doped region;
a nanowire protruding from the first doped region and being in direct contact with the first doped region;
an interlayer dielectric layer over the first doped region;
a dielectric layer surrounding the nanowire, and a top portion of the nanowire being uncovered by the dielectric layer;
a first gate layer surrounding the dielectric layer; and
a second gate layer over the first gate layer and the interlayer dielectric layer,
wherein the semiconductor device is without the second gate layer on the interlayer dielectric layer between the at least two transistors.

11. The semiconductor device of claim 10, wherein the nanowire has a diameter in the range from about 4 nm to 15 nm.

12. The semiconductor device of claim 10, wherein the nanowires have a pitch in the range from about 10 nm to 40 nm.

13. The semiconductor device of claim 10, wherein the dielectric layer is a high-k dielectric layer.

14. The semiconductor device of claim 13, wherein the high-k dielectric layer has a thickness in the range from about 3 nm to 20 nm.

15. The semiconductor device of claim 10, wherein the first gate layer and the second gate layer are a first metal gate layer and a second metal gate layer respectively.

16. The semiconductor device of claim 15, wherein the materials of the first metal gate layer and the second metal gate layer are independently selected from titanium nitride (TiN), tantalum nitride (TaN), titanium aluminide (TiAl), or a combination thereof.

17. The semiconductor device of claim 10, further comprising a second doped region, wherein the nanowires are sandwiched by the first doped region and the second doped region.

18. The semiconductor structure of claim 10, wherein the nanowires are vertical nanowires.

19. The semiconductor structure of claim 10, wherein the material of the interlayer dielectric layer is oxide or nitride.

20. The semiconductor structure of claim 10, wherein the semiconductor device is without the second gate layer on one side of the first gate layer of at least one of the transistors.

* * * * *